United States Patent [19]

Satoh et al.

[11] Patent Number: 5,070,034
[45] Date of Patent: Dec. 3, 1991

[54] PROCESS FOR PRODUCING A SEMICONDUCTOR MEMORY DEVICE

[75] Inventors: Tamotsu Satoh; Takao Yonehara; Yoshio Nakamura, all of Atsugi, Japan

[73] Assignee: Canon Kabushiki Kaisha, Tokyo, Japan

[21] Appl. No.: 590,585

[22] Filed: Sep. 28, 1990

Related U.S. Application Data

[63] Continuation of Ser. No. 361,680, Jun. 2, 1989, abandoned, which is a continuation-in-part of Ser. No. 96,503, Sep. 15, 1987, abandoned.

[30] Foreign Application Priority Data

Sep. 18, 1986 [JP] Japan .................. 61-218139

[51] Int. Cl.$^5$ .............................. H01L 21/70
[52] U.S. Cl. ........................ 437/52; 437/90; 437/915
[58] Field of Search .............. 148/DIG. 26, 25, 150, 148/109, 152, 33, 33.2; 156/610–614; 427/248.1, 255.1; 357/23.5, 23.6; 437/41, 43, 48, 51, 52, 59, 60, 62, 81, 83, 89, 90, 108, 110, 915, 973, 976

[56] References Cited

U.S. PATENT DOCUMENTS

| | | | |
|---|---|---|---|
| 3,620,833 | 11/1971 | Gleim et al. | 437/83 |
| 4,131,496 | 12/1978 | Weitzel et al. | 156/612 |
| 4,174,422 | 11/1979 | Mathews et al. | 156/610 |
| 4,279,688 | 7/1981 | Abrahams et al. | 156/613 |
| 4,479,847 | 10/1984 | McCaldin et al. | 156/624 |
| 4,549,926 | 10/1985 | Corboy, Jr. et al. | 156/612 |
| 4,670,088 | 6/1987 | Tsaur et al. | 437/89 |
| 4,727,047 | 2/1988 | Bozler et al. | 437/89 |

FOREIGN PATENT DOCUMENTS

| | | | |
|---|---|---|---|
| 0244081 | 11/1987 | European Pat. Off. | |
| 0028327 | 2/1984 | Japan | 437/83 |
| 0184518 | 10/1984 | Japan | 437/83 |
| 48701 | 1/1987 | Japan | 357/23.6 |
| 0239928 | 10/1988 | Japan | 437/83 |
| 0239929 | 10/1988 | Japan | 437/62 |
| 0239932 | 10/1988 | Japan | 437/83 |

OTHER PUBLICATIONS

Kamins, T. I. "MOS Transistors in Beam-Recrystallized Polysilicon", IEDM-82, pp. 420–423.
Sturm et al., "A Three-Dimensional Folded Dynamic RAM in Beam-Recrystallized Polysilicon", IEEE Electron Device Letters, vol. EDL-5, No. 5, May 1984 pp. 151–153.

Primary Examiner—Olik Chaudhuri
Assistant Examiner—William Bunch
Attorney, Agent, or Firm—Fitzpatrick, Cella, Harper & Scinto

[57] ABSTRACT

A semiconductor memory device is provided with memory cells each having a capacitor for accumulating an electric charge and a transistor for charging and discharging the capacitor. The memory device comprises a substrate, an insulator layer formed thereon and a monocrystalline semiconductor layer formed thereon. The capacitor is composed of said monocrystalline semiconductor layer, the insulator layer and the substrate while the transistor is formed in the monocrystalline semiconductor layer.

3 Claims, 11 Drawing Sheets

PROCESS FOR PRODUCING A SEMICONDUCTOR MEMORY DEVICE

This application is a continuation of application Ser. No. 07/361,680 filed June 2, 1989, now abandoned, which is a division, of application Ser. No. 07/096,503, filed Sept. 15, 1987, now abandoned.

BACKGROUND OF THE INVENTION

1. Field of the Invention

The present invention relates to a semiconductor memory device having memory cells each composed of a capacitor for accumulating an electric charge and a transistor for charging and discharging said capacitor, and a process for producing said memory device.

2. Related Background Art

Semiconductor memories can be roughly classified into read-only memories and random access memories. In the following there will be explained the vertical structure of a MOS dynamic memory (DRAM) as a representative example of the semiconductor memories.

Figure 1:
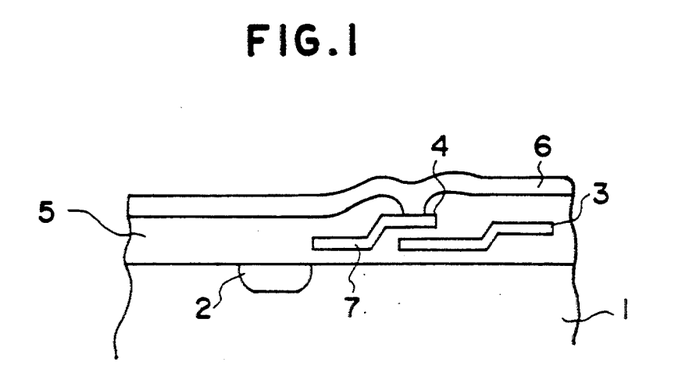
FIG. 1 is a vertical cross-sectional view of a DRAM.

FIG. 1 is a vertical cross-sectional view of a DRAM wherein, in a silicon substrate 1, a diffusion layer 2 is formed to constitute a bit line or a drain. A first polysilicon electrode 3 constitutes a capacitor electrode. An aluminum electrode 6, constituting a word line, contacts a second polysilicon electrode 4 which is connected to the gate 7 of a MOS transistor. Two polysilicon electrodes are insulated by an oxide layer 5. A source diffusion layer is not provided, but an inversion layer below the two polysilicon electrodes serves as the source domain and the other electrode of the capacitor.

Figure 2:
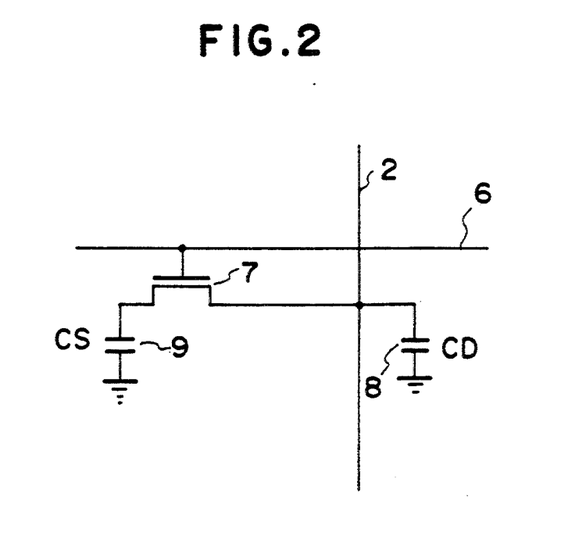
FIG. 2 is a circuit diagram of one bit of said DRAM.

FIG. 2 is a circuit diagram of one bit of the above-explained DRAM, wherein same components as those in FIG. 1 are represented by same numbers.

In the circuit shown in FIG. 2, the readout voltage VD is represented by:

$$VD = VS \times CS/(CS + CD)$$

wherein CD is the parasite capacitance 8 of the bit line 2, CS is the capacitance of the capacitor 9, and VS is the voltage accumulated in said capacitor 9. Thus the readout voltage VD decreases with the increase in the memory capacity, due to the increase in the capacitance of the bit line. As the performance of the sense amplifier and the fine geometry patterning with the photolithographic process are now approaching limit, it is necessary to increase the capacitance of the capacitor 9 or to reduce the parasite capacitance 8, in order to obtain a same output voltage while increasing the capacity of the memory.

In the former method it has been proposed to increase the capacitance per unit area through the use of a trench capacitor.

On the other hand, in the latter method, there has been proposed the use of a SOS (silicon-on-sapphire) structure.

However a memory employing such trench capacitor requires a complex manufacturing process, due to the presence of steps required for forming said trench.

Also the SOS structure has been associated with drawbacks that the monocystalline silicon layer formed on sapphire shows lattice defects due to the difference in lattice constant of the two, and that the leak current of the memory is influenced unfavorably due to diffusion of aluminum, which a component of sapphire, into the thin silicon layer.

SUMMARY OF THE INVENTION

An object of the present invention is to provide a semiconductor memory device of a simple structure allowing high integration and of a stable characteristic, and a process for producing such memory device.

Another object of the present invention is to provide a semiconductor memory device having plural memory cells each composed of a capacitor for accumulating an electric charge and a transistor for charging or discharging said capacitor, wherein said capacitor is composed of a substrate, an insulator layer formed thereon and a monocrystalline semiconductor layer formed thereon, and said transistor is formed in said monocrystalline semiconductor layer.

Still another object of the present invention is to provide a process for producing a semiconductor memory device having memory cells each composed of a capacitor for accumulating an electric charge and a transistor for charging and discharging said capacitor which comprises forming, on an insulating layer formed on a substrate, a nucleation surface with a material different from that of said insulator layer in such a manner as to have a nucleation density sufficiently higher than that of said insulator layer and as to have sufficiently small nucleus size allowing growth of single nuclei, growing a single crystal from the semiconductor nucleus developed in said nucleation surface to obtain a monocrystalline semiconductor layer, and forming said capacitor with said monocrystalline semiconductor layer, said insulator layer and said substrate while forming said transistor in said monocrystalline semiconductor layer.

DETAILED DESCRIPTION OF THE PREFERRED EMBODIMENTS

Now the present invention will be clarified in detail by embodiments thereof shown in the attached drawings.

FIGS. 3(A) to (L) are vertical cross-sectional views showing the manufacturing process of the semiconductor memory device of the present invention.

Figure 3:
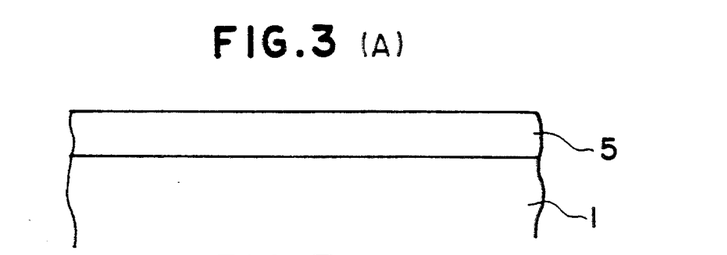
FIG. 3(A) to (L) are vertical cross-sectional views showing the manufacturing process of the semiconductor memory device of the present invention.

At first, as shown in FIG. 3(A), an oxide layer 5 is formed by thermal oxidation on an n-type silicon substrate 1.

Then, as shown in FIG. 3(B), an active area, where the transistor and the capacitor are to be formed, is etched, and thermal oxidation is conducted again.

Subsequently, as shown in FIG. 3(C), an area where the capacitor is to be formed, is etched to form a thin thermal oxidation film of a thickness of 150–500Å.

Then $Si_3N_4$ is deposited and patterned as shown in FIG. 3(D) to form a very small nucleation surface 13 consisting of $Si_3N_4$. In order that a single nucleus alone is formed, the size of the $Si_3N_4$ film should not exceed several microns. Subsequently Si is selectively grown on said oxide film 5 with a mixture of HCl and $H_2$ with $SiH_2Cl_2$, $SiCl_4$, $SiHCl_3$ or $SiH_4$ at a substrate temperature of 700°–1100° C. under a pressure of ca. 100 Torr. As shown in FIG. 3(E), a single crystal of silicon 14 can be grown around the minute $Si_3N_4$ nucleation surface on $SiO_2$ within a time of several tens of minutes, to a size of several tens of microns under an optimum condition of growth.

Then, as shown in FIG. 3(F), there is conducted reactive ion etching (RIE), showing different etching speeds for Si and $SiO_2$, to etch Si only, thereby forming a thin layer 15 of monocrystalline silicon (hereinafter called monocrystalline layer). If the surface of the monocrystalline layer 15 is not flat, etching is conducted after mechanical lapping.

Then, as shown in FIG. 3(G), an $SiO_2$ layer and an $Si_3N_4$ layer are formed on the monocrystalline layer 15, and the latter is patterned to obtain an $Si_3N_4$ layer 16. Subsequently P or As ions are implanted after unnecessary area is covered with photoresist, and photoresist is thereafter removed.

A LOCOS oxide film 17 is then formed, and the $Si_3N_4$ layer is removed as shown in FIG. 3(H).

Then, as shown in FIG. 3(I), a polysilicon electrode 18 constituting a word line is formed by patterning, and a source-drain diffusion layer 19 is formed as shown in FIG. 3(J).

Then, as shown in FIG. 3(K), an interlayer insulation film 20 of $SiO_2$ is deposited by CVD, and a contact hole 21 is opened.

Figure 3L:
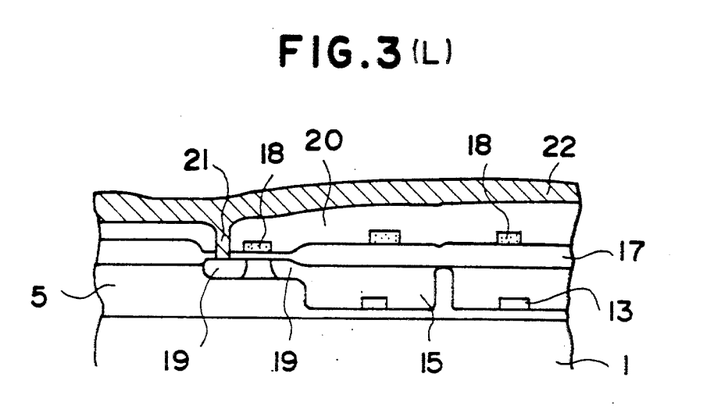

Finally, as shown in FIG. 3(L), an aluminum wiring, constituting a bit line 22, is formed, and a passivation layer is deposited.

Figure 4:
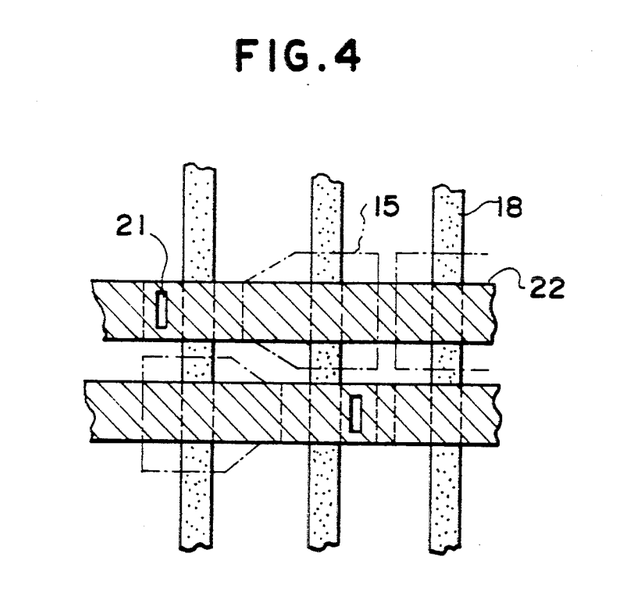
FIG. 4 is a schematic plan view of the semiconductor memory device of the present invention.

FIG. 4 is a schematic plan view of the semiconductor memory device of the present invention, wherein same components as those in FIG. 3(K) are represented by same numbers.

As shown in FIG. 4, the accumulating capacitor 9 is formed between the monocrystalline layer 15 and the Si substrate 1, utilizing the thinner portion of the oxide film 5 in order to increase the capacity per area. On the other hand, the diffusion layer constituting the bit line is formed on a stepped oxide film of 2000–7000 Å, in order to avoid parasite capacitance.

In the present embodiment, the transistor, wiring etc., can be formed on a deposition surface composed of insulating $SiO_2$, so that the unnecessary parasite capacitance can be reduced.

In the following there will be detailedly explained the method for forming the monocrystalline layer 15.

For better understanding of the present invention, there will be explained the selective deposition method for selectively forming a deposition layer on a deposition surface. The selective deposition method enables selective formation of a thin film on a substrate, utilizing differences, among different materials, of factors influencing the nucleation in the thin film forming process such as surface energy, adhesion coefficient, dissociation coefficient, surface diffusion speed etc.

Figure 5:
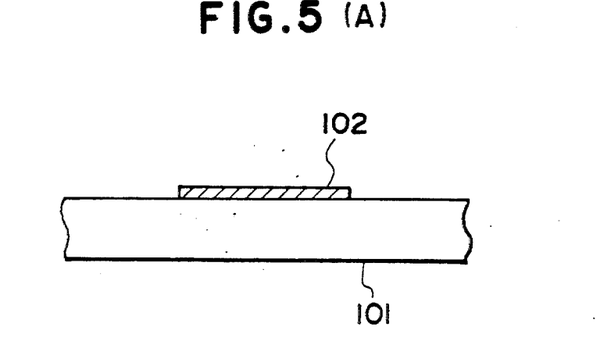
FIGS. 5(A) and 5(B) are schematic views showing a selective deposition process.

FIGS. 5(A) and 5(B) illustrate the selective deposition method.

At first, as shown in FIG. 5(A), on a substrate 101, there is formed a thin film 102, in a desired area, with a material with the above-mentioned factors different from those of the substrate 1. Then under a suitable condition with a suitable material, a thin film 103 can be deposited only on the thin film 102 but not on the substrate 101. This phenomenon allows to obtain a self-aligned thin film 103, without relying on the conventional photolithography utilizing photoresist.

In such selective deposition method there can be employed, for example, $SiO_2$ as the substrate 101, Si, GaAs or $Si_3N_4$ as the thin film 102, and Si, W, GaAs or InP as the thin film 103.

Figure 6:
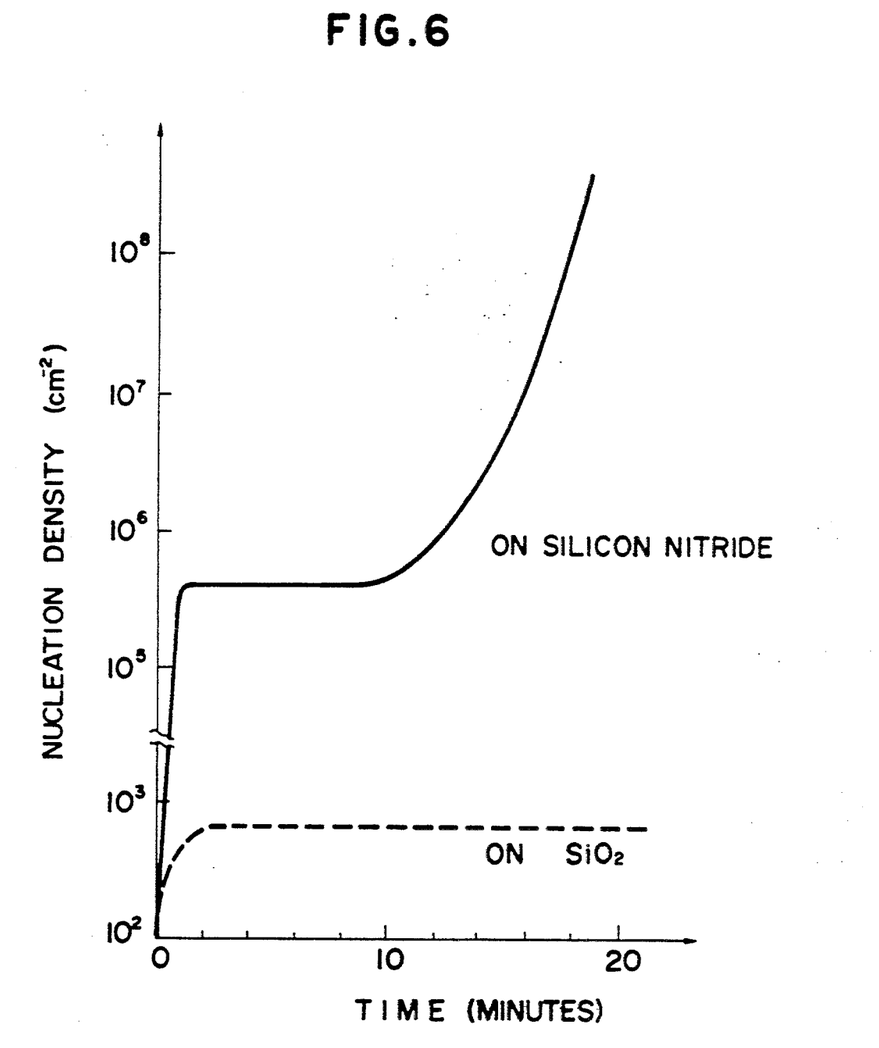
FIG. 6 is a chart showing time-dependent change in the nucleation density on deposited $SiO_2$ and on deposited silicon nitride.

FIG. 6 shows the time-dependent change of the nucleation density on $SiO_2$ and on silicon nitride.

As shown in FIG. 6, the nucleation density on $SiO_2$ becomes saturated at a level lower than $10^3 cm^{-2}$ soon after the start of deposition, and remains almost same even at 20 minutes from the start.

On the other hand, on silicon nitride ($Si_3N_4$) the nucleation density is once saturated at a level of ca. $4 \times 10^5 cm^{-2}$ and remains at this level for about 10 minutes, but increases rapidly thereafter. In this example the deposition was conducted by CVD method at a pressure of 175 Torr and a temperature of 1000° C., utilizing $SiCl_4$ gas diluted with $H_2$ gas. Other gasses such as $SiH_4$, $SiH_2Cl_2$, $SiHCl_3$ or $SiF_4$ can provide similar results with suitable regulation of pressure and temperature. Also vacuum evaporation may be employed for this purpose.

In this method the nucleation on $SiO_2$ is negligibly small, but the addition of HCl gas in the reaction gas allows to further reduce the nucleation on $SiO_2$, thereby completely avoiding the Si deposition on $SiO_2$.

This phenomenon is principally dependent on the difference, between the surfaces of $SiO_2$ and $Si_3N_4$, in the absorption coefficient, dissociation coefficient, surface diffusion coefficient etc., to Si, but the selective deposition is also caused by the reaction of Si atoms with $SiO_2$ to form silicon monoxide of a high vapor pressure to etch $SiO_2$ itself, while such etching does not occur on silicon nitride (T. Yonehara, S. Yoshioka, S. Miyazawa; Journal of Applied Physics 53, 6839, 1982).

It is therefore possible, as shown in FIG. 6, to obtain a large difference in the nucleation density, by selecting $SiO_2$ and $Si_3N_4$ for the surfaces receiving the deposition, and silicon for the material deposited. Though $SiO_2$ is desirable as the material of deposition surface, other compounds $SiO_x$ can also provide a difference $\Delta SN$ in the nucleation density.

Naturally this method is not limited to these materials, but a difference in nucleation density in excess of $10^3$ as shown in FIG. 6 is enough for the purpose, and sufficiently selective film formation can also be achieved with the materials to be explained later.

Besides said difference in the nucleation density can be obtained by locally implanting Si or N on $SiO_2$, thereby forming an area of excess in Si or N.

It is thus possible to selectively grow a single crystal only on the small nucleation surface, through the use of such selective deposition method, by forming a nucleation surface with a material with a nucleation density sufficiently larger than that of the deposition surface, with a sufficiently small size so as to grow only a single nucleus.

Since the selective growth of single crystal is determined by the state of electrons, particularly dangling bonds, on the deposition surface, the material with the low nucleation density (for example $SiO_2$) need not be a bulk material but can be formed on the surface of a substrate or an arbitrary material.

Figure 7A:
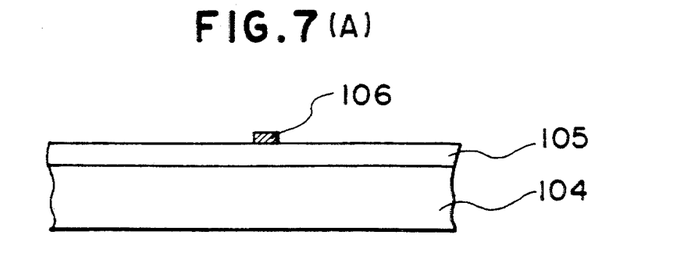
FIGS. 7(A) to (D) are views showing an example of single crystal formation.
Figure 7B:
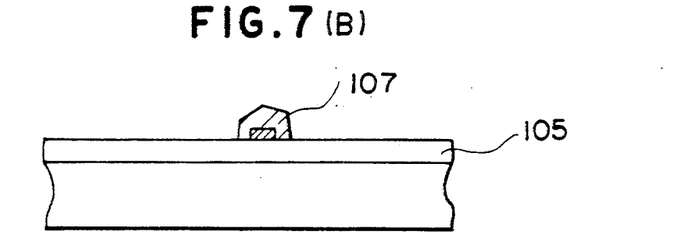
Figure 7C:
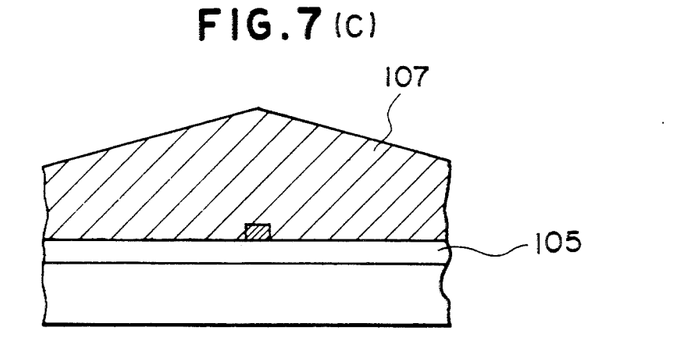
Figure 7D:
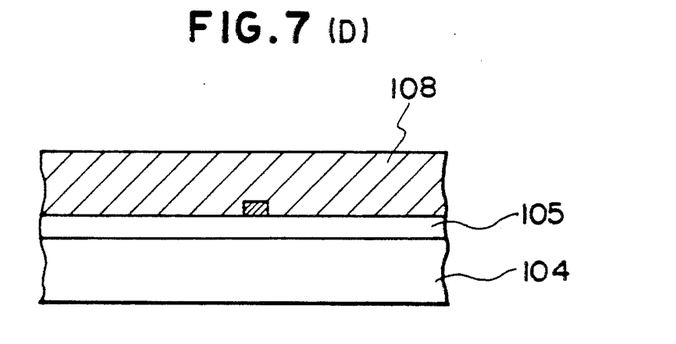
Figure 8:
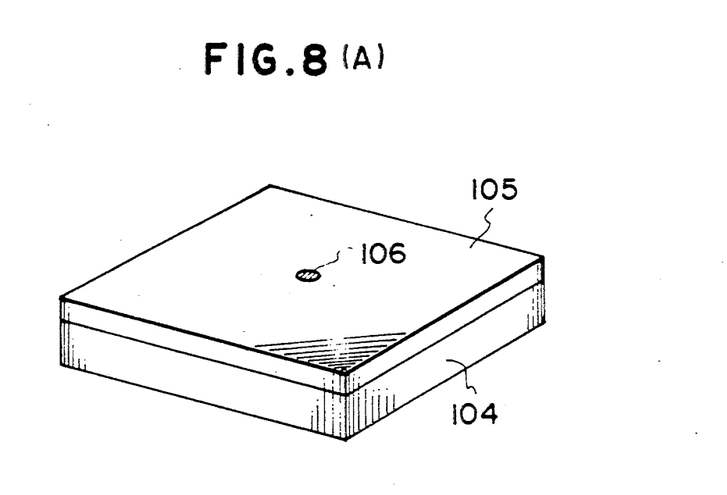
FIGS. 8(A) and 8(B) are perspective view of the substrate in states corresponding to FIGS. 5(A) and 5(D)

FIGS. 7(A) to 7(D) show an example of the process for forming single crystal, and FIGS. 8(A) and 8(B) are perspective views of the substrate respectively corresponding to FIGS. 7(A) and 7(D).

At first, as shown in FIGS. 7(A) and 8(A), a thin film 105 with a low nucleation density enabling selective deposition is formed on a substrate 104, and a thin film of a different material with a larger nucleation density is deposited and patterned for example by a photolithographic process to obtain a nucleation surface 106 with a sufficiently small size. The substrate 104 may have an arbitrary size, an arbitrary crystal structure and an arbitrary composition, and the different material constituting the nucleation surface includes the modified material rich in Si or N, obtained by implantation of Si or N ions into the thin film 105 (nucleation surface) as explained above.

Then a single nucleus of the thin film material is formed only on the nucleation surface 106, under a suitable deposition condition. The nucleation surface 106 has to be formed so small that only a single nucleus can be formed thereon. The size of said nucleation surface 106, though variable according to the constituting material, should be several microns or smaller. The nucleus maintains the monocrystalline structure in the course of growth to form an island-shaped monocrystalline particle 107 as shown in FIG. 7(B). In order to obtain such monocrystalline island 107, it is essential to determine such conditions as to completely avoid the nucleation on the thin film 105 as already explained before.

The monocrystalline island 107 further grows around the nucleation surface 106 while maintaining the monocrystalline structure, to eventually cover the entire thin film 105 as shown in FIG. 7(C).

Subsequently the single crystal 107 is flattened by etching or lapping to obtain, on the thin film 105, a single crystal layer 108 allowing formation of a desired device, as shown in FIG. 7(D) or 8(B).

Because of the presence of the thin film 105 constituting the nucleation surface, the substrate 104 may be composed of an arbitrary material. Also the single crystal layer can be easily formed on a substrate 104 having functional devices thereon.

In the foregoing embodiment the nucleation surface is composed of the thin film 105, but it may be composed of a substrate of a material with a low nucleation density enabling the selective nucleation.

In the following the process for forming said monocrystalline layer will be explained in greater detail.

The thin film 105 is composed of $SiO_2$. Naturally it is possible to use a quartz substrate, or to form a $SiO_2$ layer by sputtering, chemical vapor deposition or vacuum evaporation on an arbitrary substrate composed for example of metal, semiconductor, magnetic material, piezoelectric material or insulating material. Though the nucleation surface is preferably composed of $SiO_2$, it may also be composed of $SiO_x$ with variable values of x.

On thus formed $SiO_2$ layer 105, a silicon nitride layer ($Si_3N_4$ in this case) or a polycrystalline silicon layer is formed by gaseous growth under a reduced pressure as the nucleation surface, and is patterned by an ordinary photolithography or a lithographic process utilizing X-ray, electron beam or ion beam to obtain a small nucleation surface of a size not exceeding several microns, preferably in the order of one micron.

Then Si is selectively grown on said substrate with a gaseous mixture of HCl and $H_2$ with $SiH_2Cl_2$, $SiCl_4$, $SiHCl_3$, $SiF_4$ or $SiH_4$, with a substrate temperature of 700°–1100° C. and under a pressure of ca. 100 Torr.

Within a period of several tens of minutes, a monocrystalline silicon particle 107 grows from the nucleation surface 106, composed of silicon nitride or polycrystalline silicon on $SiO_2$, even to a size of several tens of microns or larger under optimum conditions.

Subsequently there is conducted reactive ion etching (RIE), having different etching rates for Si and $SiO_2$, to etch and flatten Si only, thereby obtaining a polycrystalline silicon layer with controlled domain size. Then domain boundaries are removed to obtain a monocrystalline silicon island 108. If the surface of the monocrystalline particle 107 is significantly irregular, the etching is conducted after mechanical lapping.

A field effect transistor formed on thus formed monocrystalline silicon layer 108 of a size of several tens of microns, free from domain boundaries, shows characteristics comparable to those of a transistor formed on a monocrystalline silicon wafer.

Due to electric separation from the neighboring monocrystalline silicon layer 108 by means of $SiO_2$, C-MOS transistors formed on said layers are free from mutual interference. Also since the activation layer in each device is thinner than that in case a silicon wafer is used, the device is free from erroneous operation caused by a charge in wafer, generated by an external radiation. In addition a higher operating speed can be achieved because of a reduced parasite capacitance. Furthermore it is possible to use an arbitrary substrate other than Si wafer, and to obtain a three-dimensional integrated circuit of multiple functions through the formation of a single crystal layer on another substrate of semiconductor, piezoelectric material or dielectric material.

Composition of silicon nitride

The above-mentioned difference in nucleation density between the nucleation surface and the non-nucleation surface can be obtained not only by $Si_3N_4$ but also by silicon nitride of different composition.

In the plasma CVD process for forming a silicon nitride film at a low temperature by decomposing $SiH_4$ gas and $NH_3$ gas in high frequency plasma, the ratio of Si and N in the deposited silicon nitride film can be significantly varied by a change in the flow rate ratio of said gasses.

Figure 9:
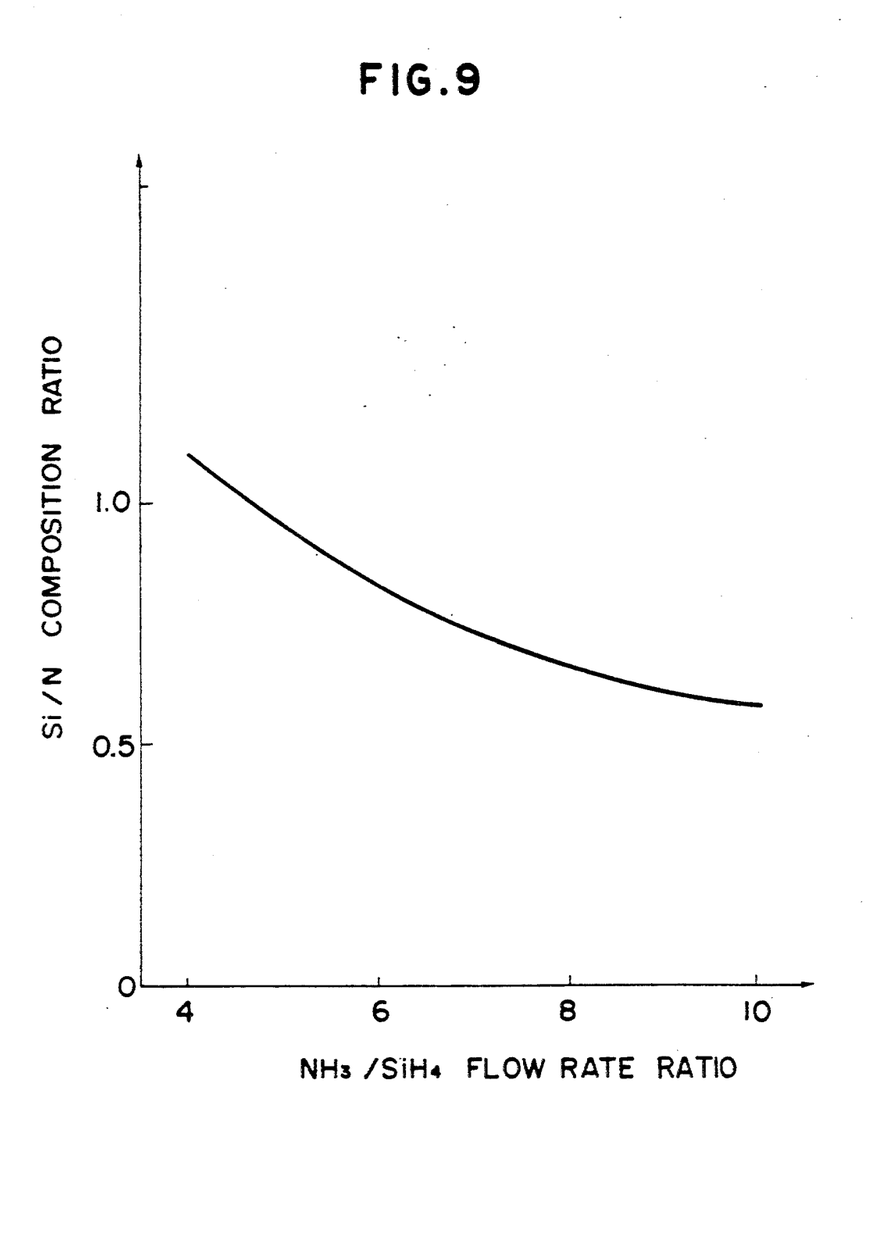
FIG. 9 is chart showing the change in Si/N composition ratio in the formed silicon nitride, as a function of flow rate ratio of $SiH_4$ and $NH_3$.

FIG. 9 shows Si/N ratio in the deposited silicon nitride film as a function of the flow rate ratio of $SiH_4$ and $NH_3$.

In this example the deposition was conducted with an RF output of 175 W and a substrate temperature of 380° C., and the flow rate of $NH_3$ gas was varied while that of SiH$_4$ gas was fixed at 300 cc/min. Through Auger electron spectroscopy it was determined that the Si/N ratio in the silicon nitride film varied from 1.1 to 0.58 in response to a change of the flow rate ratio of NH$_3$/SiH$_4$ from 4 to 10, as shown in FIG. 9.

On the other hand, a silicon nitride film, formed by a reduced-pressure CVD process utilizing SiH$_2$Cl$_2$ gas and NH$_3$ gas under a pressure of 0.3 Torr and a temperature of ca. 800° C. had a composition close to the stoichiometric composition Si$_3$N$_4$(Si/N=0.75).

Also a silicon nitride film formed by thermal treatment of Si in ammonia or N$_2$ at ca. 1200° C. (thermal nitrization) had a composition closer to the stoichiometric ratio, since the formation is conducted under a thermal equilibrium.

These silicon nitride films, when used as the above-explained nucleation surface of a higher nucleation density than that of SiO$_2$, show different silicon nucleation densities depending on the composition.

Figure 10:
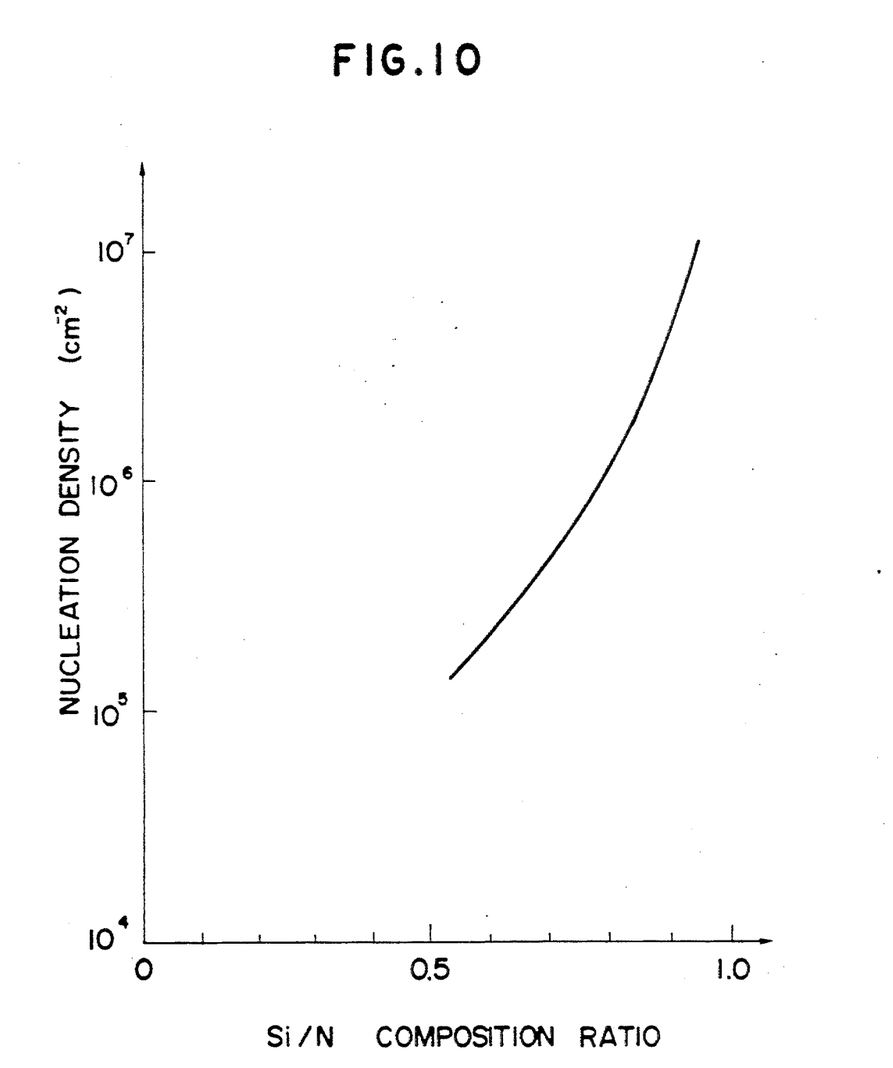
FIG. 10 is a chart showing the nucleation density as a function of Si/N composition ratio.

FIG. 10 shows the nucleation density as a function of Si/N ratio in the composition. As will be understood from FIG. 10, a change in the composition of the silicon nitride film significantly influences the nucleation density of silicon grown thereon. The nucleation in this example was conducted by reacting SiCl$_4$ gas, at a pressure of 175 Torr and a temperature of 1000° C., with H$_2$ gas.

Such variation of nucleation density depending on the composition of silicon nitride influences the size of the nucleation surface, composed of silicon nitride, which has to be formed small enough for single nucleus growth. Stated differently, a silicon nitride composition of a large nucleation density cannot provide single nucleus growth unless the nucleation surface is formed very small.

Consequently it is necessary to suitably select the nucleation density and the optimum size of silicon nitride allowing single nucleus growth. For example under a depositing condition with a nucleation density of 10$^5$ cm$^{-2}$, a single nucleus can be obtained if the size of silicon nitride surface is about 4 μm or smaller. (Formation of nucleation surface consisting of different material by ion implantation)

A difference in nucleation density to Si may also be achieved by implanting ions of Si, N, P, B, F, Ar, He, C, As, Ga or Ge locally into the SiO$_2$ surface of low nucleation density, thereby forming a modified area which functions as a nucleation surface with a high nucleation density.

For example the SiO$_2$ surface is covered with photoresist, and is locally exposed through the steps of exposure, development and dissolution of said photoresist in desired areas.

Then Si ions are implanted with an energy of 10 KeV and a density of $1 \times 10^{16} - 1 \times 10^{18}$ cm$^{-2}$, utilizing SiF$_4$ as the source gas. The stroke is 114 Å, and the Si concentration on the surface reaches ca. 10$^{22}$ cm$^{-3}$. Since SiO$_2$ is amorphous, the area implanted with Si remain also amorphous.

Instead of the modified area formation by ion implantation through a photoresist mask, it can also be achieved by Si ion implantation with a concentrated ion beam.

A modified area with an excess in Si is obtained on SiO$_2$ surface by photoresist stripping after said ion implantation. Then gaseous growth of Si is conducted on the non-nucleation SiO$_2$ surface containing the above-mentioned modified area.

Figure 11:
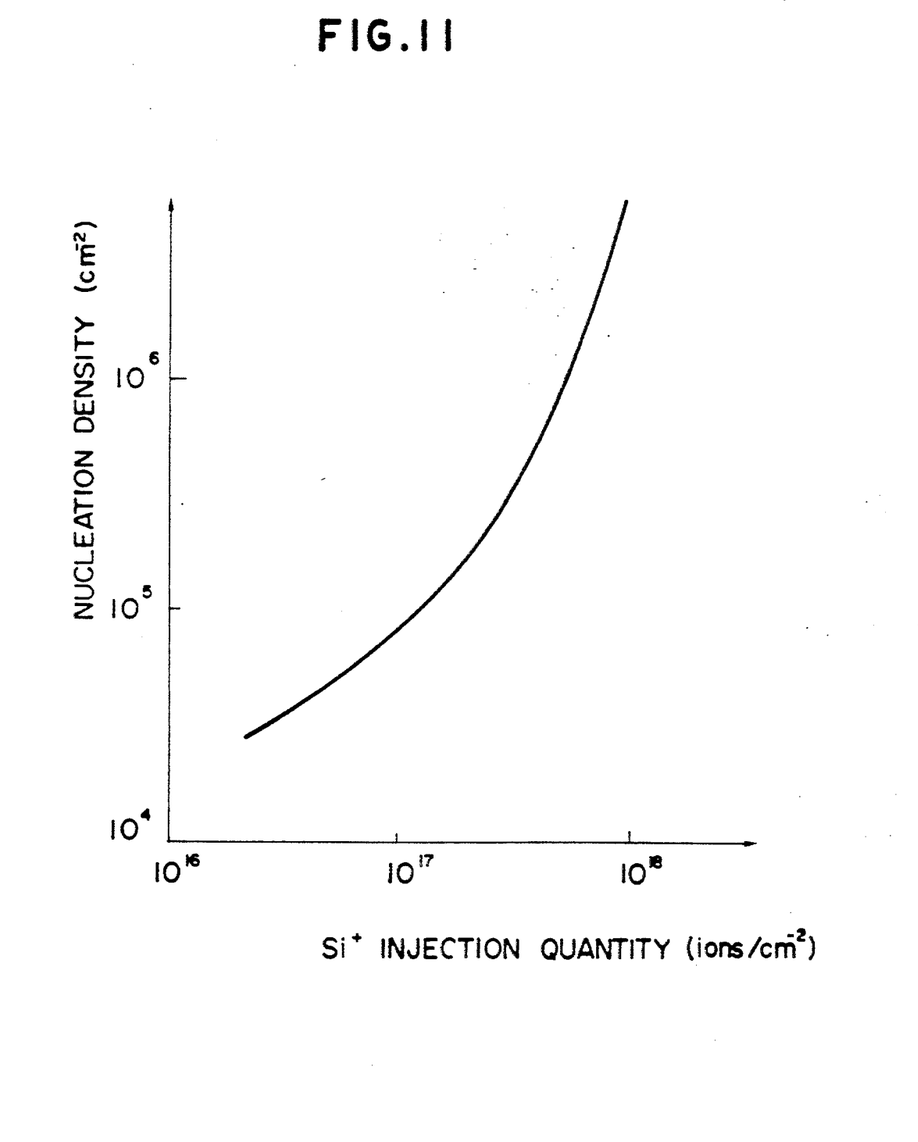
FIG. 11 is a chart showing the nucleation density as a function of quantity of Si injection.

FIG. 11 shows the relationship between the amount of Si ion implantation and the nucleation density.

As will be understood from FIG. 11, the nucleation density increases with the increase in the amount of implanted silicon ions.

It is therefore possible, by forming said modified area sufficiently small, to utilize said modified area as the nucleation area for growing single silicon nucleus and to grow a single crystal thereon.

A sufficiently small modified area for single nucleus formation can be easily formed through a photoresist patterning or the use of a concentrated ion beam.

Si deposition other than by CVD

Silicon single crystal growth through selective nucleation can be achieved not only by the CVD method but also by evaporation of Si in vacuum ($<10^{-6}$ Torr) with an electron gun and deposition on a heated substrate. Particularly a molecular beam epitaxy (MBE) conducting evaporation under ultra high vacuum ($<10^{-9}$ Torr) is known to completely avoid the Si nucleation on SiO$_2$, since the Si beam and SiO$_2$ start to react at a substrate temperature of 900° C. or higher (T. Yonehara, S. Yoshioka and S. Miyazawa; Journal of Applied Physics, 53, 10, p6839, 1983).

This phenomenon was utilized in forming a single silicon nucleus with complete selectivity on each of minute silicon nitride films distributed on SiO$_2$ and growing a single crystal of silicon thereon. The deposition was conducted with vacuum of 10$^{-8}$ Torr or lower, a Si beam intensity of $9.7 \times 10^{14}$ atoms/cm$^2$·sec and a substrate temperature of 900°-1000° C.

In this case, a reaction SiO$_2$+Si→2SiOβ generates a reaction product SiO with a very high vapor pressure, so that SiO$_2$ itself is etched by Si through this evaporation.

On the other hand, silicon nitride is free from such etching and causes nucleation and deposition.

For forming a nucleation surface with a high nucleation density, there may be employed tantalum oxide (Ta$_2$O$_5$) or silicon oxynitride (SiON) in addition to silicon nitride. A single crystal can be grown in a similar manner from a small nucleation surface of these substances.

The monocrystalline layer 15 can be formed on the oxide film 5 through the single crystal growing process detailedly explained above.

As detailedly explained in the foregoing, in the semiconductor memory device of the present embodiment and the manufacturing process therefor, a monocrystalline semiconductor layer is formed on an insulator layer to constitute a capacitor, and a transistor is formed on said monocrystalline semiconductor layer, so that the parasite capacity can be reduced and a high integration is rendered possible. Also the growth of monocrystalline semiconductor from a minute nucleation surface of a different material present on an insulator surface allows to avoid the crystal lattice defects or the aluminum diffusion as in the SOS process and to obtain stable memory characteristic with reduced leak current. Also the transistor formed in the monocrystalline semiconductor layer shows a mobility in the channel comparable to that of a transistor formed in a single crystal wafer, thereby enabling high speed access.

We claim:

1. A process for producing a semiconductor memory device provided with memory cells, each said memory cell having a capacitor for accumulating an electric charge and a transistor for charging and discharging said capacitor, said capacitor comprising a substrate, an insulator layer disposed on said substrate and a monocrystalline semiconductor layer on said insulator layer, said method comprising the steps of:

(a) forming, on said insulator layer provided on said substrate, an amorphous nucleation surface with a different material of a nucleation density sufficiently larger than that of the material constituting said insulator layer and of a size sufficiently small as to allow the growth of only one nucleus;

(b) growing a single crystal from the single nucleus of a semiconductor material grown on said amorphous nucleation surface to form a monocrystalline semiconductor layer; and (c) forming said transistor in said monocrystalline semiconductor layer.

2. A process for producing a semiconductor memory device according to claim 1, wherein said insulator layer is formed sufficiently thick except in an area constituting said capacitor.

3. The process for producing a semiconductor memory device according to claim 1, wherein said transistor has a gate electrode on a gate insulator on said monocrystalline semiconductor layer.

* * * * *

UNITED STATES PATENT AND TRADEMARK OFFICE
CERTIFICATE OF CORRECTION

PATENT NO. : 5,070,034

DATED : December 3, 1991

INVENTOR(S) : TAMOTSU SATOH, ET AL.

It is certified that error appears in the above-identified patent and that said Letters Patent is hereby corrected as shown below:

Title Page:
IN [63] RELATED U.S. APPLICATION DATA

"continuation-in-part" should read --division--.

COLUMN 1

Line 7, "division," should read --division--.
Line 65, "monocystalline" should read --monocrystalline--.

COLUMN 3

Line 11, "formed," should read --formed--.
Line 34, "$Si_3 4_N$" should read --$Si_3N_4$--.

COLUMN 4

Line 62, "compounds" should read --compounds of--.

COLUMN 7

Lines 41-43, set as subhead.
Line 58, "remain" should read --remains--.

UNITED STATES PATENT AND TRADEMARK OFFICE
CERTIFICATE OF CORRECTION

PATENT NO. : 5,070,034
DATED : December 3, 1991
INVENTOR(S) : TAMOTSU SATOH, ET AL.

It is certified that error appears in the above-identified patent and that said Letters Patent is hereby corrected as shown below:

<u>COLUMN 8</u>

Line 33, "$SiO_2 + Si \rightarrow 2SiO\beta$" should read --$SiO_2 + Si \rightarrow 2SiO\uparrow$--.

Signed and Sealed this

Sixth Day of July, 1993

Attest:

MICHAEL K. KIRK

Attesting Officer     Acting Commissioner of Patents and Trademarks